(12) United States Patent
Tihanyi

(10) Patent No.: US 6,507,071 B1
(45) Date of Patent: Jan. 14, 2003

(54) LATERAL HIGH-VOLTAGE SIDEWALL TRANSISTOR

(75) Inventor: Jenö Tihanyi, Kirchheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/694,435

(22) Filed: Oct. 23, 2000

Related U.S. Application Data

(63) Continuation of application No. PCT/DE99/00703, filed on Mar. 15, 1999.

(51) Int. Cl.$^7$ .................. H01L 29/76; H01L 29/94; H01L 31/062; H01L 29/74; H01L 31/111
(52) U.S. Cl. ............... 257/343; 257/330; 257/339; 257/341; 257/141; 257/162
(58) Field of Search .................. 257/559, 330, 257/331, 343, 339, 341, 162, 141

(56) References Cited

U.S. PATENT DOCUMENTS 6,097,063 A * 8/2000 Fujihira .................. 257/339

FOREIGN PATENT DOCUMENTS

| DE | 43 09 764 C2 | 9/1994 | .................. 257/341 |
| DE | 196 04 043 A1 | 8/1997 | .................. 257/341 |
| EP | 0164096 | * 12/1985 | .................. 257/341 |
| EP | 0 735 589 A2 | 10/1996 | .................. 257/343 |
| GB | 2 309 336 A | 7/1997 | .................. 257/343 |
| JP | 10 079 503 A | 3/1998 | .................. 257/343 |

* cited by examiner

Primary Examiner—Steven Loke
(74) Attorney, Agent, or Firm—Laurence A. Greenberg; Werner H. Stemer; Ralph E. Locher

(57) ABSTRACT

A lateral high-voltage sidewall transistor configuration includes a low-doped semiconductor substrate of a first conductivity type and a low-doped epitaxial layer of a second conductivity type disposed on the semiconductor substrate. First semiconductor layers of the first conductivity type and second semiconductor layers of the second conductivity type are disposed in an alternating configuration in the epitaxial layer. A source region and a drain region of the second conductivity type extend through the first and second semiconductor layers as far as the semiconductor substrate. A gate electrode includes a gate insulating layer lining a gate trench and includes a conductive material which fills the gate trench. The gate electrode extends through the first and second semiconductor layers as far as the semiconductor substrate and is disposed adjacent to the source region toward the drain region. A semiconductor region of the first conductivity type is disposed on at least one side of the source region and the gate trench, the semiconductor region extending as far as the semiconductor substrate and extending under the source region and partially under the gate insulating layer.

12 Claims, 1 Drawing Sheet

LATERAL HIGH-VOLTAGE SIDEWALL TRANSISTOR

CROSS-REFERENCE TO RELATED APPLICATION

This application is a continuation of copending International Application No. PCT/DE99/00703, filed Mar. 15, 1999, which designated the United States.

BACKGROUND OF THE INVENTION

Field of the Invention

The invention relates to a lateral high-voltage sidewall transistor.

German Patent No. DE 43 09 764 C2 discloses a conventional lateral high-voltage transistor in which the drain drift path is formed of an n-conducting region in which one or more p-conductive regions are embedded.

SUMMARY OF THE INVENTION

It is an object of the invention to provide a lateral high-voltage sidewall transistor which has a good conductivity and which can withstand high voltages and which can be easily fabricated.

With the foregoing and other objects in view there is provided, in accordance with the invention, a lateral high-voltage sidewall transistor configuration, including:

- a low-doped semiconductor substrate of a first conductivity type;
- a low-doped epitaxial layer of a second conductivity type disposed on the semiconductor substrate;
- first semiconductor layers of the first conductivity type and second semiconductor layers of the second conductivity type, the first and second semiconductor layers being disposed in an alternating configuration in the epitaxial layer;
- a source region of the second conductivity type extending through the first and second semiconductor layers as far as the semiconductor substrate;
- a drain region of the second conductivity type extending through the first and second semiconductor layers as far as the semiconductor substrate;
- the epitaxial layer being formed with a gate trench;
- a gate electrode including a gate insulating layer lining the gate trench and including a conductive material filling the gate trench, the gate electrode extending through the first and second semiconductor layers as far as the semiconductor substrate and being disposed adjacent to the source region and extending in a direction toward the drain region;
- the source region and the gate trench each having at least one side; and
- a semiconductor region of the first conductivity type disposed on the at least one side of the source region and the gate trench, the semiconductor region extending as far as the semiconductor substrate and extending under the source region and extending partially under the gate insulating layer.

In other word, the object of the invention is achieved by a lateral high-voltage sidewall transistor in which alternating semiconductor layers of the one conductivity type and of the other conductivity type are provided on a low-doped semiconductor substrate of the other conductivity type, in which furthermore a source region of the one conductivity type and a drain region of the one conductivity type each extend through the semiconductor layers as far as the semiconductor substrate, in which a gate electrode including a gate trench provided with a gate insulating layer and filled with conductive material likewise extends through the semiconductor layers as far as the semiconductor body and is provided adjacent to the source region in the direction of the drain region, and in which, at least on one side of the source region and the gate trench, a semiconductor region of the other conductivity type is provided, extending as far as the semiconductor substrate and extending under the source region and also extending partially under the gate electrode.

The conductivity of this sidewall transistor increases with the number of pairs of such semiconductor layers having alternating conductivity types.

The one conductivity type (second conductivity type) is preferably the n conductivity type. The other conductivity type (first conductivity type) is thus the p conductivity type, and the semiconductor substrate is therefore $p^-$-doped.

During the production of the lateral high-voltage sidewall transistor according to the invention, first of all semiconductor layers with alternately opposite conductivity types are applied to the entire area of a semiconductor substrate, for example a $p^-$-doped semiconductor substrate. This can preferably be done by a number of epitaxial depositions and subsequent ion implantations. However, it is also possible, with the aid of the SOI technique (SOI=silicon on insulator) to use as the semiconductor substrate an oxidized silicon wafer, onto which, with the aid of the direct-wafer-bonding technique, the semiconductor layers having alternating conductivity types are then applied. For this purpose, the so-called smart cut technique with subsequent epitaxial deposition can also be applied, if appropriate, in which thin layers of a first semiconductor wafer are transferred to a second semiconductor wafer by direct bonding.

The area density of the n doping, for example phosphorus, and of the p doping, for example boron, in the semiconductor layers should not exceed about $10^{12}$ cm$^{-2}$ when silicon is used as the semiconductor material, that is to say should not lie above the "breakdown concentration". If silicon carbide (SiC) is used as the semiconductor material, then an area density of the n doping or the p doping in the semiconductor layers of about $10^{13}$ cm$^{-2}$ should be aimed at, but the density should not exceed this value.

For producing the transistor configuration, first of all a structure is produced in which n-doped and p-doped semiconductor layers are applied one after another to a weakly $p^-$-doped semiconductor body, the semiconductor layers not exceeding an area density for the doping of the order of magnitude of $10^{12}$ cm$^{-2}$ for silicon and $10^{13}$ cm$^{-2}$ for silicon carbide.

Trenches for the source and drain regions and for the body region are introduced into the structures produced in this way. An n dopant, for example phosphorus or arsenic, is then diffused into the surrounding semiconductor material from the walls of the trenches for the source region and the drain region. In a similar way, a p dopant, that is to say for example boron, is made to diffuse from the walls of the body trench into the surrounding semiconductor material. Following this diffusion, the respective trenches for source, drain and body can be filled up with doped polycrystalline silicon, in order in this way to form feed lines to the individual levels of the semiconductor layers. These feed lines can be separated from one another by an insulating layer of silicon dioxide, for example. If appropriate, it is also possible to reinforce the polycrystalline silicon further with a conductive material.

After the production of the source region, the drain region and the p-conductive semiconductor region, performed in the above manner by diffusion from the respective trenches, the gate trenches are introduced and coated or lined with an insulating layer of silicon dioxide, for example. The gate trenches are then filled up with $n^+$-conductive polycrystalline silicon.

Contact is therefore made with the n-conductive semiconductor layers along the drift path through the source region and drain region, that is to say the semiconductor layers are connected via the respective trenches for the source electrode and the gate electrode. In a similar way, the p-conductive semiconductor layers of the drift path are connected through the p-conductive semiconductor region and respectively the body trench.

The position of the source region and p-conductive semiconductor region, as indicated above, means that the source regions are interrupted by the p-conductive semiconductor region, and a channel zone is produced in which the current can flow along the trench wall of the gate trench when there is a positive gate-source voltage.

The lateral high-voltage sidewall transistor according to the invention can, if necessary, also be equipped with a field plate, which has a distance from the semiconductor layers which increases continuously or step by step in the direction from source to drain and is embedded in an insulating layer which, for example, is formed of silicon dioxide or silicon nitride.

The drain region is expediently enclosed by the source region at a distance of the drift path. This does not apply to an implementation of the lateral high-voltage sidewall transistor in the SOI technique already mentioned. Here, the source region and drain region are preferably provided parallel to each other. The trenches are then etched through the entire epitaxial region as far as the insulating oxide.

When a field plate is used, the n doping should predominate in the drift path, so that preferably, in addition to respective pairs of semiconductor layers of alternating conductivity type, there is a further n-conductive layer with an area doping concentration in the range of $10^{12}$ cm$^{-2}$, without an associated p-conductive layer.

In accordance with another feature of the invention, a source region of a further, second lateral high-voltage sidewall transistor is provided adjacent to a first lateral high-voltage sidewall transistor such that the source regions are separated by the semiconductor region of the first conductivity type.

In accordance with yet another feature of the invention, the expitaxial layer and the first and second semiconductor layers are doped such that the epitaxial layer together with the first and second semiconductor layers have an overall n-doping which is higher than an overall p-doping.

In accordance with a further feature of the invention, the first and second semiconductor layers are epitaxial, ion-implanted layers.

In accordance with another feature of the invention, the first and second semiconductor layers are produced by wafer bonding with an oxidized silicon wafer.

Although it was assumed above that the one conductivity type is the n conductivity type and the other conductivity type is the p conductivity type, if appropriate, the converse conductivity types can also be provided.

Other features which are considered as characteristic for the invention are set forth in the appended claims.

Although the invention is illustrated and described herein as embodied in a lateral high-voltage sidewall transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
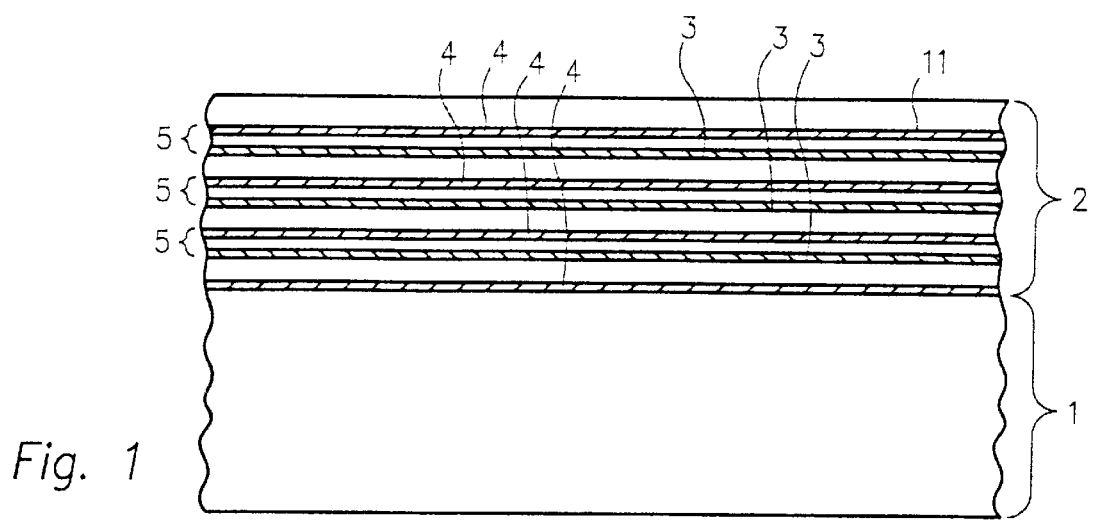
FIG. 1 is a diagrammatic, partial sectional view illustrating the starting material for producing the lateral high-voltage sidewall transistor according to the invention.
Figure 2:
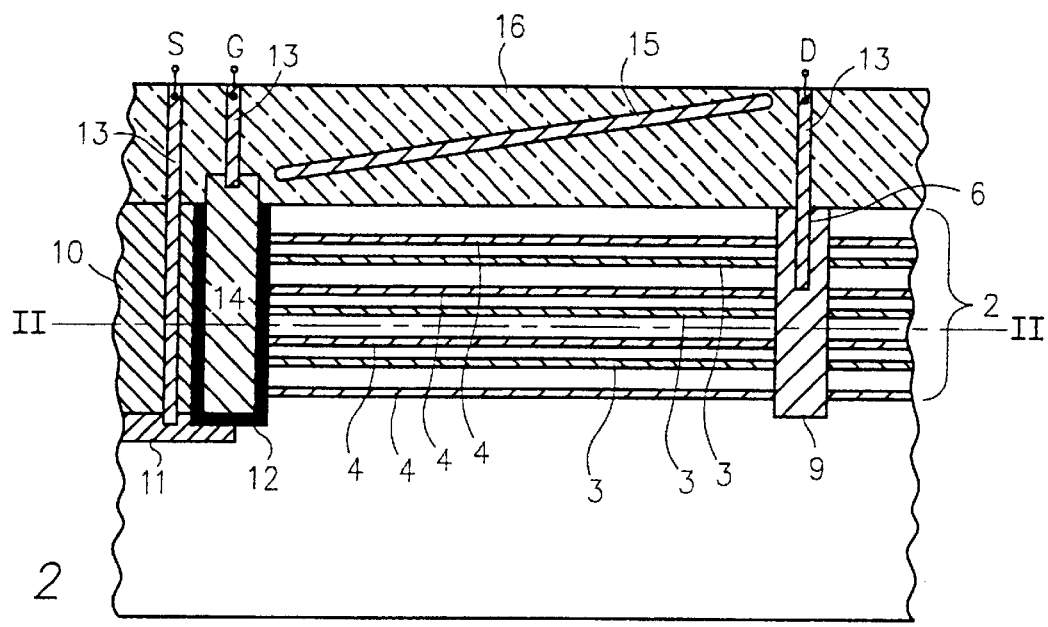
FIG. 2 is a diagrammatic, partial sectional view along section line III—III in FIG. 3 illustrating the finished lateral high-voltage sidewall transistor according to the invention.
Figure 3:
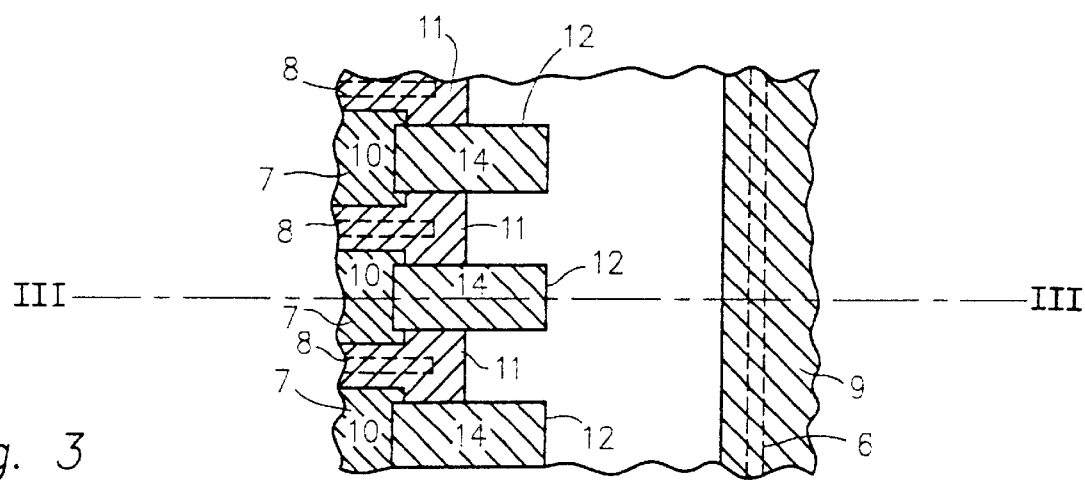
FIG. 3 is diagrammatic, partial sectional view of the lateral high-voltage sidewall transistor along section line II—II in FIG. 2 with a different scale than FIG. 2.

Although FIGS. 1 to 3 are sectional views, not all of the sectional areas are hatched in order to improve clarity. Referring now to the figures of the drawings in detail and first, particularly, to FIG. 1 thereof, there is shown a p$^-$-conductive semiconductor substrate 1 of silicon, on which a low-doped epitaxial zone 2 has been applied. Introduced into this epitaxial zone 2 are p-doped layers 3 and n-doped layers 4, so that in the present exemplary embodiment there is a total of three pairs of layers 5.

In addition, there is an additional n-conductive layer 4 on the surface of the p$^-$-conductive semiconductor substrate 1.

The individual layers 3, 4 are preferably produced through the use of a number of epitaxial depositions and ion implantations. In the process, the dopant diffuses out of the implanted layers 3, 4 into the regions of the adjacent low-doped epitaxial zone 2 as well, so that, overall, on the p$^-$-doped semiconductor substrate 1 there is a sequence of alternating n-conductive layers and p-conductive layers, in which the n doping predominates since overall, in addition to the pairs of layers 5, there is also the additional n-conductive layer on the surface of the p$^-$-conductive semiconductor substrate 1.

The area density of the doping in the n-conductive layers 4 and in the p-conductive layers 3 lies below the breakdown concentration, that is to say at about $10^{12}$ cm$^{-2}$ for silicon and at about $10^{13}$ cm$^{-2}$ for silicon carbide.

Into the starting material shown in FIG. 1, a trench 6 for a drain region, trenches 7 for source regions and trenches 8 for body regions are then introduced (cf. in particular FIG. 3). The drain region 9 and the source regions 10 then have an n-conductive dopant, for example phosphorus, diffused into them from the trench walls. Likewise, a p-conductive dopant is diffused out of the body trenches 8, so that p-conductive semiconductor regions 11 are produced.

Following these diffusions of the n dopant for the drain region 9 and the source regions 10, and the p-conductive dopant for the semiconductor regions 11, the production of the gate trench is carried out, its wall being coated with insulating material 12, for example, silicon dioxide and/or silicon nitride.

The trenches 6, 7 and 8 for the drain region 9, the source regions 10 and the semiconductor region 11 are filled, for example, with doped polycrystalline silicon or with metallizations 13, which connect the drain region 9 to a drain electrode D and the source region 10 to a source electrode S. The gate trench is filled with n⁺-conductive polycrystalline silicon 14, which is likewise connected to a metallization 13 for a gate electrode G.

Contact is therefore made with the n-conductive layers 4 in the drift path through the source electrode S via the source regions 10, and contact is made with the p-conductive layers 3 via the semiconductor regions 11 or their metallization (not shown in the figures) introduced into the trenches 8. The semiconductor regions 8 with the p doping are in this case configured between the source regions 10 in such a way that their n doping is interrupted in the gate region, and a channel zone is produced, in which current can flow along the trench wall of the gate trench when there is a positive gate-source voltage.

The lateral high-voltage sidewall transistor according to the invention can further be equipped with a field plate 15, which is provided such that its distance from the layers 3, 4 becomes greater and greater as it approaches the drain electrode D. This field plate 15 is embedded in an insulating layer 16 of silicon dioxide. The field plate 15 can rise continuously (as shown in FIG. 2) or else step by step in the direction of the drain. The drain electrode D is expediently enclosed by the source. If such a field plate 15 is provided, the n doping should predominate in the drift path, for which reason—as was explained at the beginning—an additional n-conductive layer 4 is provided on the surface of the semiconductor substrate 1, supplementing the pairs 5.

I claim:

1. A lateral high-voltage sidewall transistor configuration, comprising:

a low-doped semiconductor substrate of a first conductivity type;

a low-doped epitaxial layer of a second conductivity type disposed on said semiconductor substrate;

first semiconductor layers of the first conductivity type and second semiconductor layers of the second conductivity type, said first and second semiconductor layers being disposed in an alternating configuration in said epitaxial layer;

a source region of the second conductivity type extending through said first and second semiconductor layers as far as said semiconductor substrate;

a drain region of the second conductivity type extending through said first and second semiconductor layers as far as said semiconductor substrate;

said epitaxial layer being formed with a gate trench;

a gate electrode including a gate insulating layer lining said gate trench and including a conductive material filling said gate trench, said gate electrode extending through said first and second semiconductor layers as far as said semiconductor substrate and being disposed adjacent to said source region in a direction toward said drain region;

said source region and said gate trench each having at least one side; and a semiconductor region of the first conductivity type disposed on said at least one side of said source region and said gate trench, said semiconductor region extending as far as said semiconductor substrate and extending under said source region and extending partially under said gate insulating layer.

2. The lateral high-voltage sidewall transistor configuration according to claim 1, wherein the first conductivity type is a p-type conductivity and the second conductivity type is an n-type conductivity.

3. The lateral high-voltage sidewall transistor configuration according to claim 2, wherein said epitaxial layer and said first and second semiconductor layers are doped such that said epitaxial layer together with said first and second semiconductor layers have an overall n-doping higher than an overall p-doping.

4. The lateral high-voltage sidewall transistor configuration according to claim 1, wherein said first and second semiconductor layers have area doping concentrations of less than $10^{12}$ cm$^{-2}$.

5. The lateral high-voltage sidewall transistor configuration according to claim 1, including:

trench walls formed in said said epitaxial layer; and said source region, said drain region, and said semiconductor region of the first conductivity type being produced by diffusion from said trench walls.

6. The lateral high-voltage sidewall transistor configuration according to claim 1, including:

a further source region to be assigned to a lateral high-voltage sidewall transistor adjacent to said source region; and said source region and said further source region being separated by said semiconductor region of the first conductivity type.

7. The lateral high-voltage sidewall transistor configuration according to claim 1, including:

a field plate disposed at a given distance from said first and second semiconductor layers, the given distance between said field plated and said first and second semicoductor layers increasing in a direction toward said drain region.

8. The lateral high-voltage sidewall transistor configuration according to claim 1, wherein said first and second semiconductor layers are epitaxial, ion-implanted layers.

9. The lateral high-voltage sidewall transistor configuration according to claim 8, wherein said source region encloses said drain region.

10. The lateral high-voltage sidewall transistor configuration according to claim 1, wherein said first and second semiconductor layers are produced by wafer bonding with an oxidized silicon wafer.

11. The lateral high-voltage sidewall transistor configuration according to claim 10, wherein said drain region and said source region are disposed substantially parallel to one another.

12. The lateral high-voltage sidewall transistor configuration according to claim 1, wherein said first and second semiconductor layers are wafer-bonded layers.

* * * * *

UNITED STATES PATENT AND TRADEMARK OFFICE
CERTIFICATE OF CORRECTION

PATENT NO.    : 6,507,071 B1                                              Page 1 of 1
DATED         : January 14, 2003
INVENTOR(S)   : Jenö Tihanyi It is certified that error appears in the above-identified patent and that said Letters Patent is hereby corrected as shown below:

Title page,
Between Items [63] and [51], please insert Item [30] as follows:
-- [30]  Foreign Application Priority Data
Apr. 23, 1998   [DE]    ……….. 198 18 300.3 --

Signed and Sealed this

Twenty-sixth Day of August, 2003

JAMES E. ROGAN
*Director of the United States Patent and Trademark Office*